(12) United States Patent
Hsu et al.

(10) Patent No.: US 7,498,202 B2
(45) Date of Patent: Mar. 3, 2009

(54) METHOD FOR DIE ATTACHING

(75) Inventors: Hung-Ta Hsu, Daliao Township, Kaohsiung County (TW); Tzu-Bin Lin, Kaohsiung (TW); Ya-Ling Huang, Kaohsiung (TW); Ya-Yu Hsieh, Lujhu Township, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 520 days.

(21) Appl. No.: 11/293,992

(22) Filed: Dec. 5, 2005

(65) Prior Publication Data

US 2006/0121644 A1   Jun. 8, 2006

(30) Foreign Application Priority Data

Dec. 6, 2004  (TW) .............................. 93137655 A

(51) Int. Cl.
*H01L 21/00*  (2006.01)

(52) U.S. Cl. ................... 438/118; 438/106; 438/113; 438/464; 257/E21.449; 257/E21.514

(58) Field of Classification Search .............. 257/E21.5, 257/E21.513
See application file for complete search history.

(56) References Cited

U.S. PATENT DOCUMENTS

| 5,110,388 A | 5/1992 | Komiyama et al. ......... 156/229 |
| 5,971,250 A * | 10/1999 | Safabakhsh et al. ......... 228/102 |
| 6,023,094 A | 2/2000 | Kao et al. ................... 257/632 |
| 6,709,953 B2 | 3/2004 | Vasquez et al. ............. 438/460 |
| 2004/0158008 A1* | 8/2004 | He et al. ....................... 526/72 |
| 2005/0046042 A1* | 3/2005 | Matsumura et al. ......... 257/782 |
| 2005/0208701 A1* | 9/2005 | Jeong et al. ................ 438/106 |

* cited by examiner

*Primary Examiner*—Walter L Lindsay, Jr.
*Assistant Examiner*—Cheung Lee
(74) *Attorney, Agent, or Firm*—Thomas, Kayden, Horstemeyer & Risley

(57) ABSTRACT

A method for die attaching is disclosed. At first, at least one die and a die-attach preform are separately provided. The die-attach preform is picked and placed upon a die carrier. Then, the die is picked and placed upon the die-attach preform. The die and the die carrier are heated and clipped, so that the die-attach preform can adhere the die and the die carrier at the same time.

15 Claims, 6 Drawing Sheets

METHOD FOR DIE ATTACHING

This application claims the benefit of Taiwan application Serial No. 93137655, filed Dec. 6, 2004, the subject matter of which is incorporated herein by reference.

BACKGROUND OF THE INVENTION

1. Field of the Invention

The invention relates in general to a method for die attaching, and more particularly to a method for die attaching by using a pick-and-place machine to complete the stack of the die-attach preform and the die.

2. Description of the Related Art

In an ordinary single-die or multiple-die package manufacturing process, the wire bonding type die must be first of all adhered to a die carrier via a die attaching material. The conventional die carrier can be a circuit substrate, a leadframe or another stacked dies. Then, the wire bonding manufacturing process is performed. Normally, the conventional die attaching material which adheres the die and the die carrier can be a thermosetting material or a thermoplastic material. During the conventional die-attaching process, a die carrier is moved to a dispensing machine or a tape attaching machine to proceed with the adhesive-dispensing or tape-attaching step, so that die attaching material such as liquid adhesive or adhering tape can be formed on the die carrier. Next, the die carrier with the liquid adhesive or adhering tape formed thereon is transported to a pick-and-place machine via a track, and a pick-and-place robot of the pick-and-place machine is used to pick and place the die on the die carrier one by one. The die carrier is adhered to the die via the die attaching material. The liquid adhesive or adhering tape used in the conventional method for die attaching requires appropriate adhesive coating equipment of the die to form the die attaching material on the die carrier in advance, and then the die carrier is transported to the picking and placing machine via a track transport equipment, so that the die is picked and placed on the die carrier one by one. The conventional method requires more equipment and takes longer time for bonding the die.

Conventional wafer-level method for die attaching to increase the efficiency is disclosed in FIGS. 1A~1F. Referring to FIG. 1A, firstly, a wafer 110 is provided. The wafer 110 comprises several dies 111, each having an active surface 112 and an opposite rear surface 113. Several bonding pads 114 are formed on the active surfaces 112 of the dies 111. Referring to FIG. 1B, a stencil 10 is disposed on the rear surfaces 113 of the dies 111 by using the stencil printing technology. The stencil 10 has several openings 11 corresponding to the rear surfaces 113. Then, a die attaching material 120 is formed on the stencil 10 and is scraped using a scraper 20. The die attaching material 120 is filled in the openings 11 of the stencil 10, and is formed on the rear surfaces 113 of the dies 111 via printing. Referring to FIG. 1C, a heating step is performed to partly solidify the die attaching material 120 of the rear surfaces 113 to become a B-stage adhering layer 121 adhered on the wafer 110. Referring to FIG. 1D, a cutting tape 30 is pasted onto the active surface 112 of the dies 111, the wafer 110 is sawn, and then the dies 111 having the B-stage adhering layer 121 is formed through singulation. In the step of sawing the wafer 110, the dies 111 are cleaned by using de-ionized water (DIW) at the same time. Then, the dies 111 is turned over to be pasted onto another tape (not shown in the diagram), so that the active surfaces 112 of the dies 111 is exposed upward to be picked and moved by a pick-and-place machine one by one. Referring to FIG. 1E, a die carrier 130 is disposed on a supporting plate 41, and a pick-and-place robot 42 with a suction head is used to suck and place one of the dies 111 having a B-stage adhering layer 121 on the die carrier 130, so that the B-stage adhering layer 121 contacts the die carrier 130. Referring to FIG. 1F, the supporting plate 41 is heated, so that the B-stage adhering layer 121 generates adherence to be adhered to the die carrier 130. According to a similar method for die attaching, disclosed in U.S. Pat. No. 6,703,075, a liquid adhesive is printed on a surface of a wafer first. After pre-heating, the liquid adhesive is converted into partly polymerized B-stage state. Then, the wafer is sawn and separated to form several dies having adhesive.

However, in the above wafer-level method for die attaching, when the dies 111 having B-stage adhering layers 121 are formed, de-ionized water is used to clean the dies 111, affecting the characteristics of the adhering layers 121. Consequently, the adhering layers 121 will change due to absorption of water, causing the adhesive between the dies 111 and the die carrier 130 to be deteriorated.

SUMMARY OF THE INVENTION

It is therefore an object of the invention to provide a method for die attaching. At first, at least a die and at least a die-attach perform are separately provided. Then, like the picking and placing of the dies, the die-attach preform is picked and placed on a die carrier, and then the die is picked and placed on the die-attach preform. The die-attach preform can adhere the die and the die carrier at the same time when the die-attach preform is heated, so the die-attach perform used as the die attaching material does not need to be disposed on a wafer in advance. Therefore, the die attaching material avoids contacting de-ionized water when the wafer is sawn and separated, hence the quality of the die attaching material can be maintained.

The invention achieves the above-identified object by providing a method for die attaching. At first, a die-attach preform which can be picked and placed by a pick-and-place machine is provided. In the pick-and-place machine, the die-attach preform is picked and placed on a die carrier, and then a die is picked and placed on the die-attach perform. On the pick-and-place machine, the die-attach preform can be heated to adhere the die and the die carrier at the same time. That is, in the die-attaching process (D/A process), the die attaching material can be provided and placed on the same pick-and-place machine, so that the step and the machine for dispensing the glue or attaching the tape in conventional packaging method can be omitted, and that the investment spent on the packaging equipment can be reduced.

The invention achieves the above-identified object by providing a method for die attaching is disclosed. At first, at least one die and a die-attach preform are provided. A chip carrier is fixed in a pick-and-place machine. The die-attach preform is picked and placed upon a die carrier. Then, the die is picked and placed upon the die-attach preform. The die and the die carrier are heated and clipped, so that the die-attach preform can adhere the die and the die carrier at the same time.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1A:
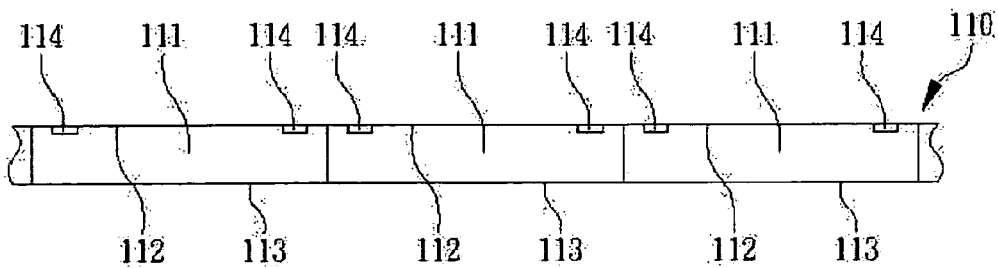
FIGS. 1A~1F (Prior Art) are cross-sectional diagrams showing a conventional wafer-level method for die attaching.
Figure 1B:
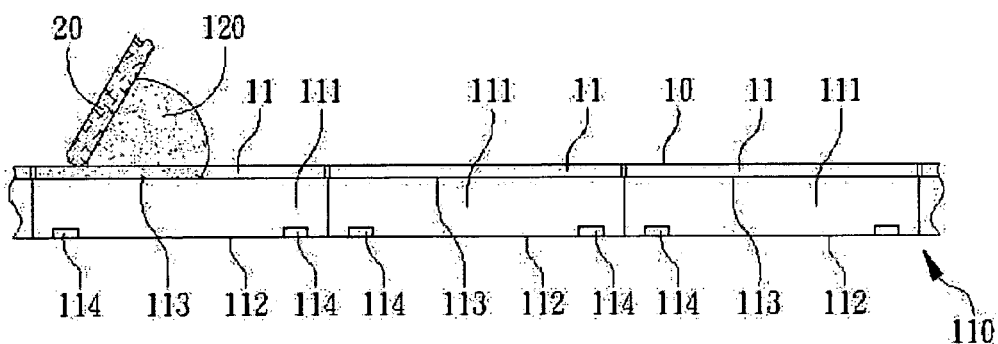
Figure 1C:
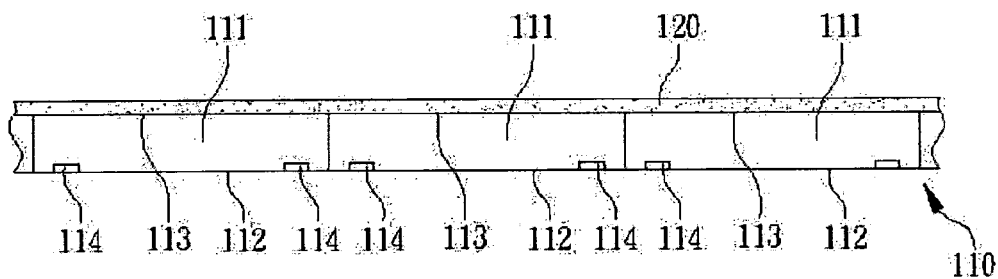
Figure 1D:
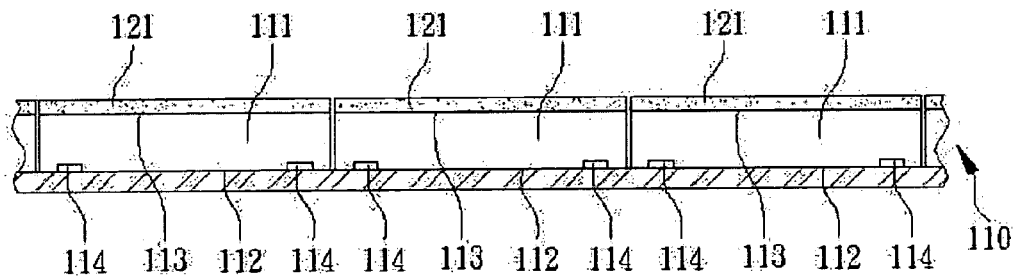
Figure 1E:
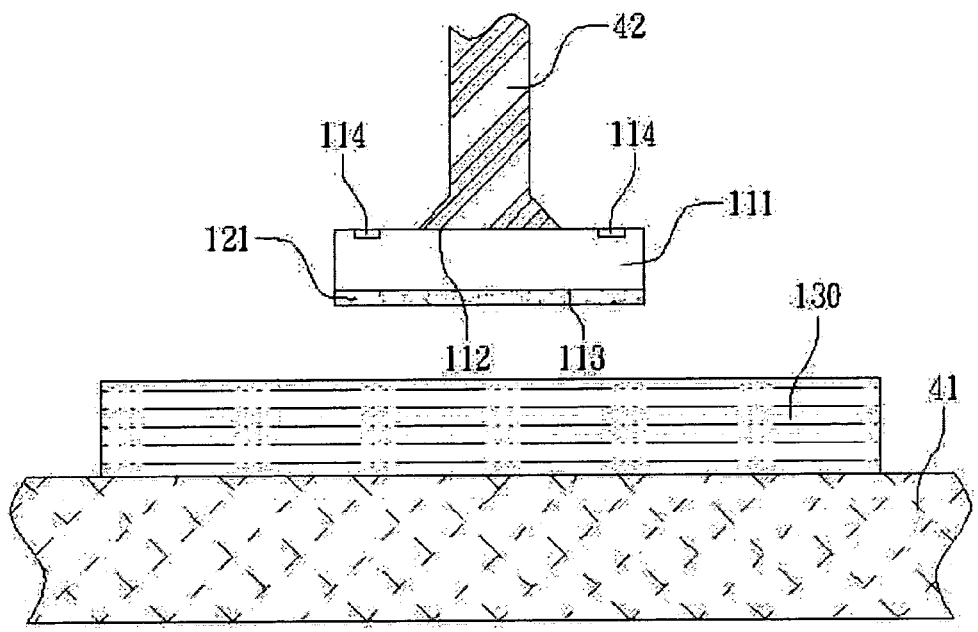
Figure 1F:
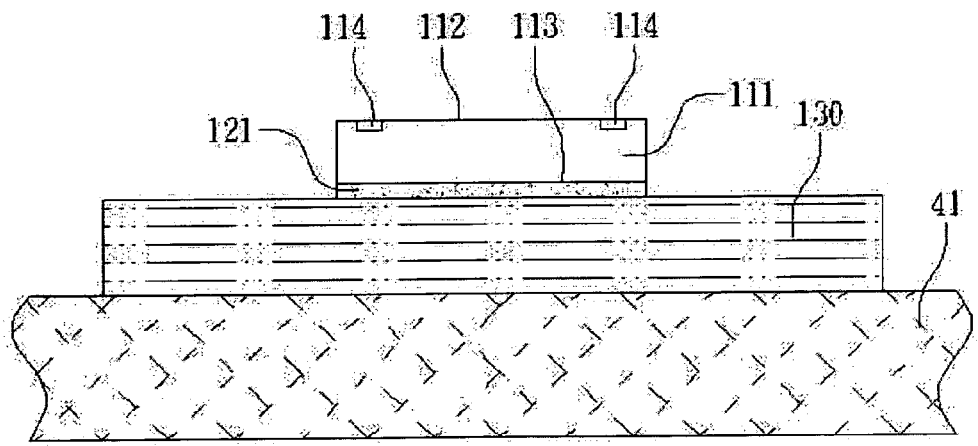
Figure 2A:
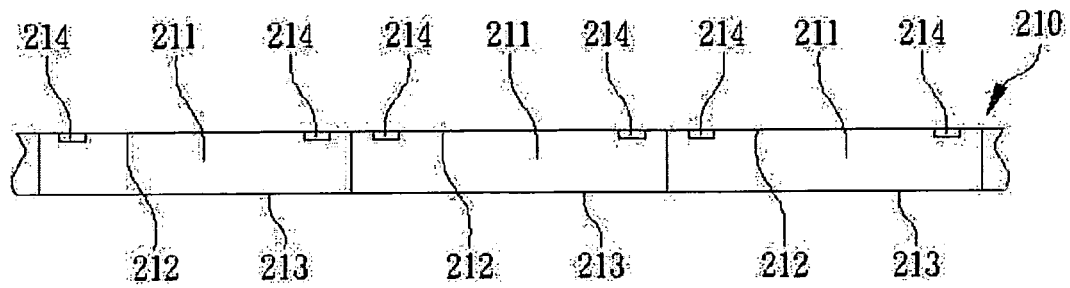
FIGS. 2A~2H are cross-sectional diagrams showing a method for single die attaching according to a first embodiment of the invention.

Referring to FIGS. 2A~2H, several cross-sectional diagrams showing a method for die attaching according to a first embodiment of the invention is explained below. Referring to FIG. 2A, firstly, a wafer 210 is provided. The wafer 210 comprises several dies 211, each having an active surface 212 and an opposite rear surface 213. Several bonding pads 214 and integrated circuit (IC) structures (not shown in the diagram) are formed on the active surfaces 212 of the dies 211.

Figure 2B:
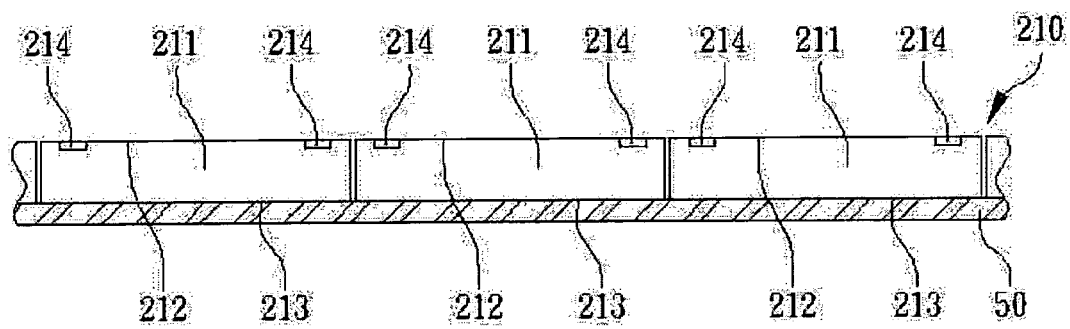

Referring to FIG. 2B, a cutting tape 50 is pasted onto the rear surface 213 of the wafer 210, the wafer 210 is sawn, and then the dies 211 are singulated. Meanwhile, the cutting tape 50 is pasted onto the rear surfaces 213 of the dies 211.

Figure 2C:
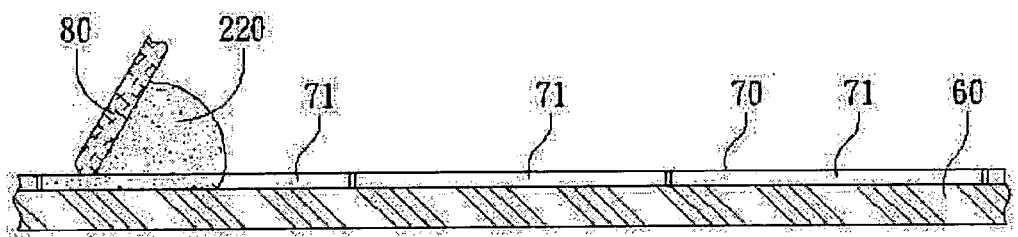

Referring to FIG. 2C, a stencil 70 is disposed on a plate 60 by using stencil printing technology is shown. The stencil 70 has several openings 71, or the stencil 70 can be replaced by a screen printing. A die attaching material 220 is provided on the stencil 70. The die attaching material 220 can be a liquid or a gluey having A-stage characteristics. The die attaching material 220, which can be scrapped using a scraper 80, is filled in the openings 71 of the stencil 70 and formed on the plate 60 via printing. The stencil 70 controls the thickness of the die attaching material 220. Next, the die attaching material 220 is appropriately heated, so that the die attaching material 220 is in B-stage state or becomes a partly solidified resin. Under normal operating temperature, the die attaching material 220 does not flow and has nil or weak adherence. The die attaching material 220 can be made of thermosetting resin, polymide or benzocyclobutene. Preferably, the die attaching material 220 is made of a material with a lower glass transition temperature (Tg), so that the reaction can be speeded up and the manufacturing process cycle can be shortened.

Figure 2D:
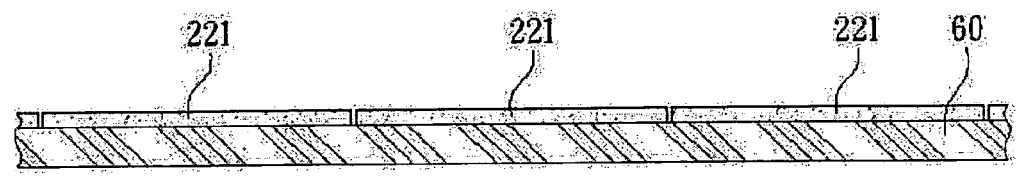

Referring to FIG. 2D, the partly solidified B-stage die attaching material 220 is mechanically sawn on the plate 60 to form several die-attach preforms 221 of appropriate size corresponding to the dies. Or, the die attaching material 220 can form the die-attach preforms 221 directly via screen printing having a smaller opening, so that the step of sawing can be omitted. In the present embodiment, the die-attach preforms 221 can be single-layer structured with B-stage characteristics. That is, the die-attach preforms 221 will have adherence after having been appropriately heated to be over the glass transition temperature (Tg) without having to form an extra adhering layer on the upper and the under surfaces of the die-attach preforms 221.

Figure 2E:
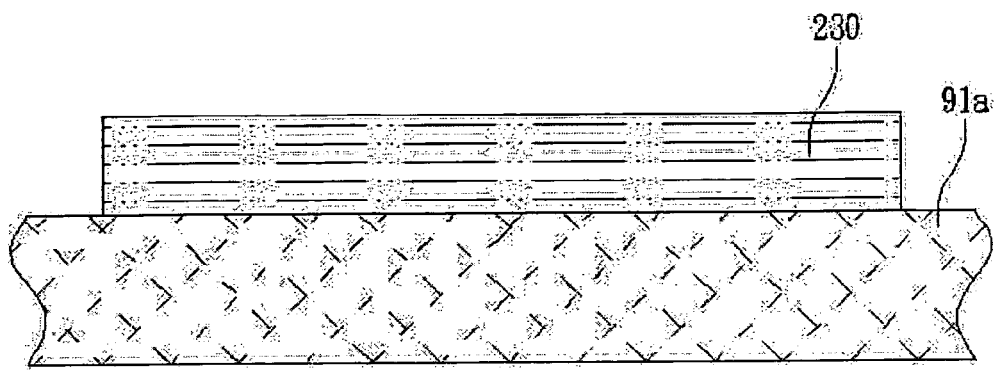

Referring to FIG. 2E, a supporting plate 91a of a pick-and-place machine is used to fix a die carrier 230. The die carrier 230 can be a substrate or a leadframe.

Figure 2F:
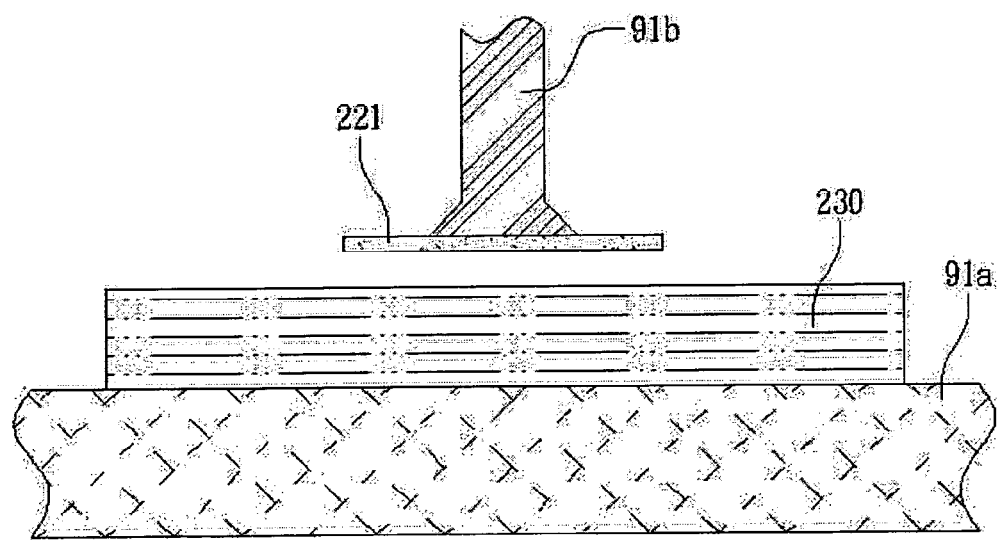

Referring to FIG. 2F, a pick-and-place robot 91b of the pick-and-place machine is used to pick and place one of the die-attach preforms 221 to the die carrier 230. Preferably, the pick-and-place robot 91b has a low-temperature vacuum suction head (not shown in the diagram) to suck the above die-attach preform 221 which are in B-stage state.

Figure 2G:
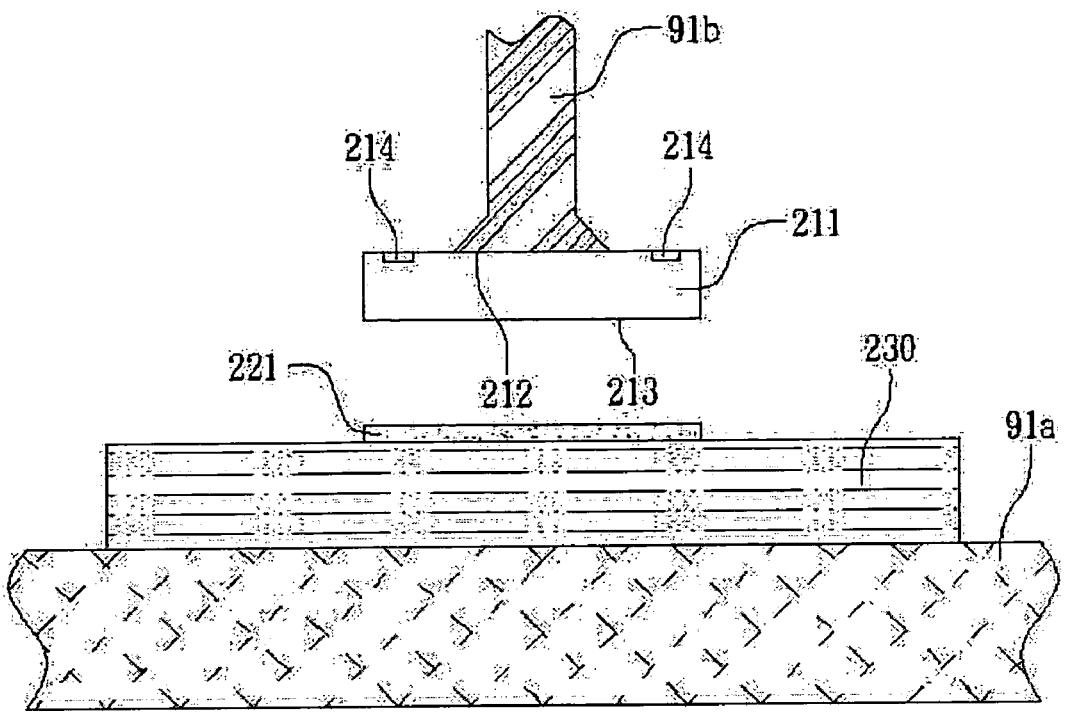

Referring to FIG. 2G, next, the pick-and-place robot 91b is used to pick and place one of the dies 211 on the die-attach preform 221, so that the rear surface 213 of the die 211 contacts the die-attach preform 221. The size of the die-attach preform 221 is equal or substantially equal to the size of the die 211.

Figure 2H:
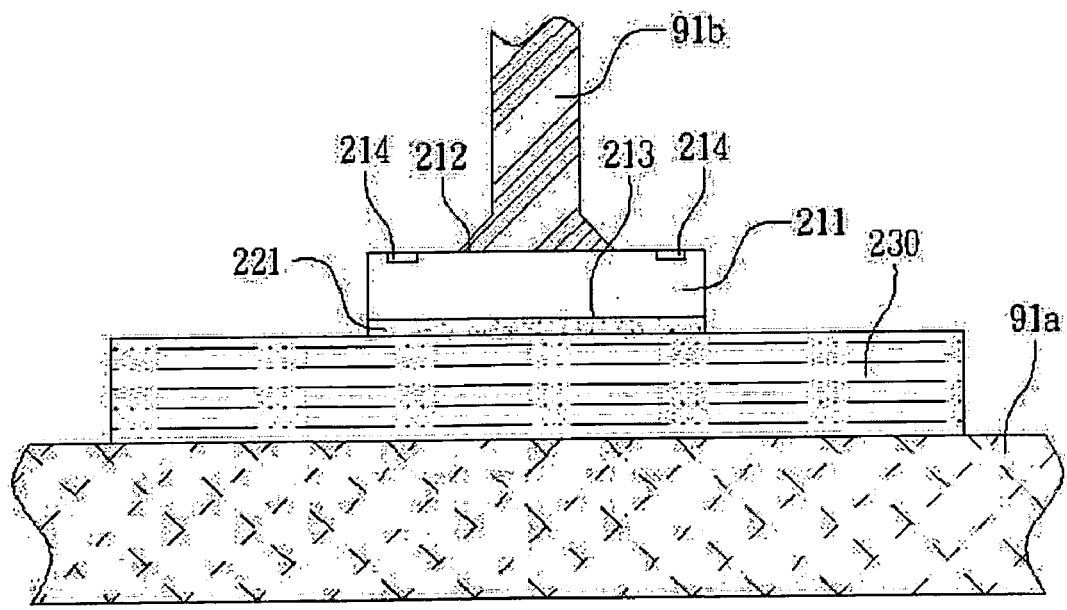

Referring to FIG. 2H, in the present embodiment, the pick-and-place robot 91b, the supporting plate 91a or other pick-and-place robots have heating function for heating the die-attach preform 221. Preferably, after the die-attach preform 221 and the die 211 are placed, the pick-and-place robot 91b and the supporting plate 91a are used to clip the die 211 and the die carrier 230, so that the die-attach preform 221 can adhere the die 211 and the die carrier 230 under appropriate heating and pressure.

In the present embodiment, the step of picking and placing the die-attach preform 221 and the step of picking and placing the die 211 are performed in the same pick-and-place machine. During the picking and placing process of the die-attach preform 221, there is nil or weak adherence between the die-attach preform 221 and the rear surface 213 of the die 211. The size of die-attach preform 221 can be substantially equal to the size of the die 211 to be easily sucked by the pick-and-place robot 91b. Besides, the size of the die-attach preform 221 can be smaller than the size of the die carrier 230 so that the attaching material can be saved.

In the above method for die attaching, the step of picking and placing the die-attach preform 221 and the step of picking and placing the die 211 can be completed in the same pick-and-place machine. The same or different pick-and-place robots 91b can be used to pick and place the die-attach preform 211 on the die carrier 230, and then the die attaching step is completed by using the pick-and-place robot 91b to heat and clip the die 211. Therefore, the step and the machine for dispensing the adhesive or attaching the tape in conventional packaging method can be omitted. The die attaching material 220 does not need to be disposed on the dies 211 in advance, so the die-attach preform 221 formed by heating the die attaching material 220 is separate from the dies 211 formed by sawing the wafer 210. Therefore, the die attaching material 220 avoids contacting de-ionized water when the wafer 210 is sawn, hence the quality of the die attaching material 220 can be maintained.

Second Embodiment

Figure 3:
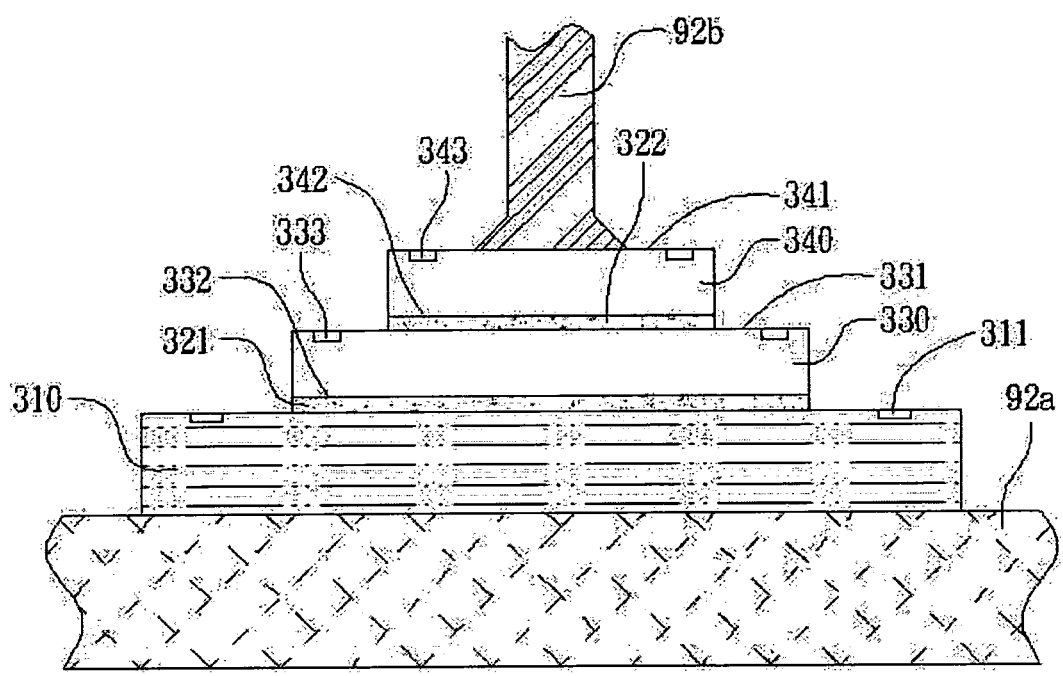
FIG. 3 is a cross-sectional diagram showing a method for multiple dies attaching according to a second embodiment of the invention.

Referring to FIG. 3, a cross-sectional diagram showing a method for multiple dies attaching according to a second embodiment of the invention is explained below. In FIG. 3, a pick-and-place machine can comprise a supporting plate 92a and at least a pick-and-place robot 92b. The supporting plate 92a can have heating function. Firstly, a die carrier 310 is provided to be fixed on the supporting plate 92a. The die carrier 310 has several connecting pads 311. Next, the pick-and-place robot 92b of the pick-and-place machine is used to pick and place a first die-attach preform 321 on the die carrier 310. In the present embodiment, the size of the first die-attach preform 321 is smaller than the size of the die carrier 310 for exposing the connecting pads 311. The pick-and-place robot 92b is used to pick and place a first die 330 on the first die-attach preform 321. An active surface 331 of the first die 330 faces upward. A rear surface 332 of the first die 330 contacts the first die-attach preform 321. In the present embodiment, the size of the first die 330 is substantially equal to the first die-attach preform 321.

Then, in the same pick-and-place machine, the pick-and-place robot 92b repeats the picking-and-placing step for picking and placing a second die-attach preform 322 on the active surface 331 of the first die 330. Preferably, the size of the second die-attach preform 322 is smaller than the size of the first die 330, so that several bonding pads 333 on the active surface 331 of the first die 330 are exposed to facilitate wiring bonding. Next, a second die 340 is picked and placed on the second die-attach preform 322, an active surface 341 of the second die 340 faces upwards, a rear surface 342 of the second die 340 contacts the second die-attach preform 322, and the size of the second die 340 can be substantially equal to the second die-attach preform 322.

The first die-attach preform 320 and the second die-attach preform 330 can be made of the same die attaching material and can be heated to a B-stage state (partly solidified) via printing, and then sawn into die-attach performs of appropriate size.

In the same pick-and-place machine, after having placed the second die 340 on the second die-attach preform 322, the pick-and-place robot 92b can directly press and clip the first die-attach preform 321, the second die-attach preform 322, the first die 330 and the second die 340 which are stacked together. In the present embodiment, the supporting plate 92a and the pick-and-place robot 92b, having heating function, can clip and heat at the same time, so that the first die-attach preform 321 and the second die-attach preform 322 can have adherence, and that the first die 330, the second die 340 and the die carrier 310 which are stacked together can be adhered.

In the method for die attaching disclosed above, the pick-and-place robot 92b can repeat the picking-and-placing step on the same pick-and-place machine, so that the first die-attach preform 321, the second die-attach preform 322, the first die 330 and the second die 340 are placed on the die carrier 310, hence omitting the step for dispensing the adhesive or attaching the tape in conventional packaging method. The die attaching material of the present embodiment does not need to be disposed between the first dies 330 and the second die 340, so that the first die-attach preform 321 and the second die-attach preform 322 can avoid contacting de-ionized water and deteriorating the quality when the wafer is sawn.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for die attaching, comprising:
    providing at least a die;
    providing at least a die-attach preform, wherein the step of providing the die-attach preform further comprises:
    forming a die attaching material on a plate by using a stencil printing method;
    partly solidifying the die attaching material to form the plurality of die-attach preforms; and
    sawing the partly solidified die attaching material to form the die-attach preform with appropriate size;
    picking and placing the die-attach preform on a die carrier;
    picking and placing the die on the die-attach preform; and
    heating the die-attach preform to adhere the die and the die carrier at the same time.

2. The method according to claim 1, wherein the die and the die carrier are clipped in the step of heating the die-attach preform.

3. The method according to claim 1, wherein the die-attach preform includes a single-layer structured B-stage resin.

4. The method according to claim 1, wherein the die carrier is fixed on a pick-and-place machine, and the step of picking and placing the die-attach preform is performed on the pick-and-place machine.

5. The method according to claim 4, wherein the pick-and-place machine comprises a supporting plate for fixing the die carrier.

6. The method according to claim 5, wherein the supporting plate has heating function.

7. The method according to claim 5, wherein the pick-and-place machine further comprises a pick-and-place robot for picking and placing the die and the die-attach preform.

8. The method according to claim 7, wherein the pick-and-place robot has heating function.

9. The method according to claim 1, wherein the size of the die-attach preform is substantially equal to the size of the die disposed above the die-attach preform.

10. The method according to claim 9, wherein the size of the die-attach preform is smaller than the size of the die carrier or the size of the die disposed under the die-attach preform.

11. The method according to claim 1, wherein the die has an active surface and an opposite rear surface, and the rear surface of the die contacts the die-attach preform in the step of picking and placing the die.

12. The method according to claim 11, wherein in the above step of picking and placing die, there is nil or weak adherence between the die-attach preform and the rear surface of the die.

13. The method according to claim 1, wherein the die carrier is selected from one of a substrate and a leadframe.

14. The method according to claim 1, further comprising:
    repeating the steps of picking and placing, so that a predetermined amount of die-attach preforms and dies are stacked on the die carrier, and
    repeating the step of heating to adhere the dies on the die carrier.

15. The method according to claim 1, wherein the size of the die-attach preform is smaller than the size of the die carrier or the size of another die disposed under the die-attach preform.

* * * * *